United States Patent [19]

Zaeschmar

[11] 4,271,584
[45] Jun. 9, 1981

[54] METHOD OF ATTACHING LED CHIP TO A HEADER

[75] Inventor: Guenther Zaeschmar, San Diego, Calif.

[73] Assignee: The United States of America as represented by the Secretary of the Navy, Washington, D.C.

[21] Appl. No.: 965,811

[22] Filed: Dec. 4, 1978

[51] Int. Cl.³ .......................................... H01L 21/479
[52] U.S. Cl. ..................................... 29/584; 29/569 L; 29/585; 29/586; 29/590; 357/66; 357/68; 357/81
[58] Field of Search ...................... 29/569 L, 572, 584, 29/585, 586, 590; 357/66, 68, 81

[56] References Cited

U.S. PATENT DOCUMENTS

| 3,172,188 | 3/1965 | Wood | 29/586 |
| 3,808,674 | 5/1974 | Francombe | 29/590 |
| 3,843,401 | 10/1974 | Carroll | 29/584 |
| 3,953,920 | 5/1976 | Endo | 29/585 |
| 4,016,644 | 4/1977 | Kurtz | 29/590 X |

Primary Examiner—R. Dean
Assistant Examiner—W. G. Saba
Attorney, Agent, or Firm—Richard S. Sciascia; Ervin F. Johnston; Thomas M. Phillips

[57] ABSTRACT

A method of fabricating light emitting diodes to prevent degradation caused by thermally induced stress. A voltage is applied across the chip to cause it to bend to a prestressed condition while it is being soldered to the header. The biasing voltage applied is continued until after the heat is removed and the solder cooled leaving the diode in the prestressed condition.

4 Claims, 2 Drawing Figures

METHOD OF ATTACHING LED CHIP TO A HEADER

BACKGROUND OF THE INVENTION

Creep-induced lattice defects caused by thermal stress in the junction area of GaAs light emitting diodes are now known to be a source for their degradation. The thermal stress is generated when the flow of current causes the temperature of the diode to increase. Degradation is generally believed to be caused by thermally induced stress which causes the semiconducting material to creep above the critical resolved sheer stress at a creep rate $$\epsilon = C\tau^{-3}e^{-Q/kT}$$

where
- C = proportionality constant
- $\tau$ = stress
- Q = activation energy
- k = Bolzman constant
- T = temperature.

Since creep causes the injurious lattice defects, it is desirable to have both stress and temperature simultaneously as low as possible. The temperature at the junction is already minimized by making the chip as thin as possible.

The present method of manufacturing diodes of this type is to solder the diode to the header (heat sink) with indium solder. After the indium has solidified then a gold wire end is attached to the top of the chip for applying voltage to the diode. For a more detailed discussion of LED fabrication, reference may be had to Semiconductor Lasers and Heterojunction LEDs by Henry Kressel and J. K. Butler, Academic Press, New York, 1977.

SUMMARY OF THE INVENTION

The present invention provides a method of fabricating LEDs to minimize the stress when the diode is in operation. It is known that an unconstrained chip subjected to a linear thermal gradient will bend free of any stress. The present invention provides for bending the diode chip so that it will be free of any stress, and soldering it to the header while in this condition. This is accomplished by the following steps.

Place chip on top of indium solder.
Spot solder lead to top of chip.
Heat indium solder to the liquid state.
Apply voltage across diode to cause diode to bend free of any stress. Remove heat from liquid indium and continue to apply prestress voltage until indium solidifies.
Remove stress voltage.

OBJECTS OF THE INVENTION

An object of the invention is the provision of LEDs that are free of the thermal stress when in operation as compared to prior known LEDs.

Another object of the invention is to fabricate LEDs so that degradation due to thermal stress while in normal operation will be minimized.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
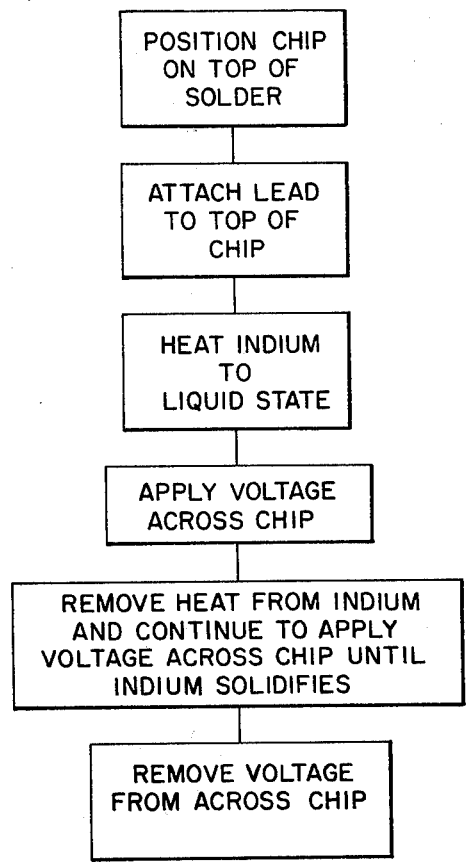
FIG. 1 is a flow diagram of the fabrication process in accordance with the invention.

Referring now to FIG. 1 wherein there is shown in diagram form the process in accordance with the teaching of the invention. The present invention relates to that portion of the fabrication of LED diodes where the diode is mounted on the header and contacts are attached. Soft solders such as indium are used to eliminate possible damage to the diodes. The indium solder is placed on the header and the chip is positioned on top of the indium solder so that the substrate is in contact with the indium. A gold wire is attached to the top of the chip to make contact with PN junction. The indium solder is heated to a liquified state by applying heat. A voltage (1.5 volts) is then applied across the diode, preferably between the header which is usually connected to ground and the gold wire which is connected to the PN junction. Heat is removed from the indium while continuing to apply voltage across the diode until the indium solidifies. Once the indium has solidified the voltage is removed from across the diode.

Figure 2:
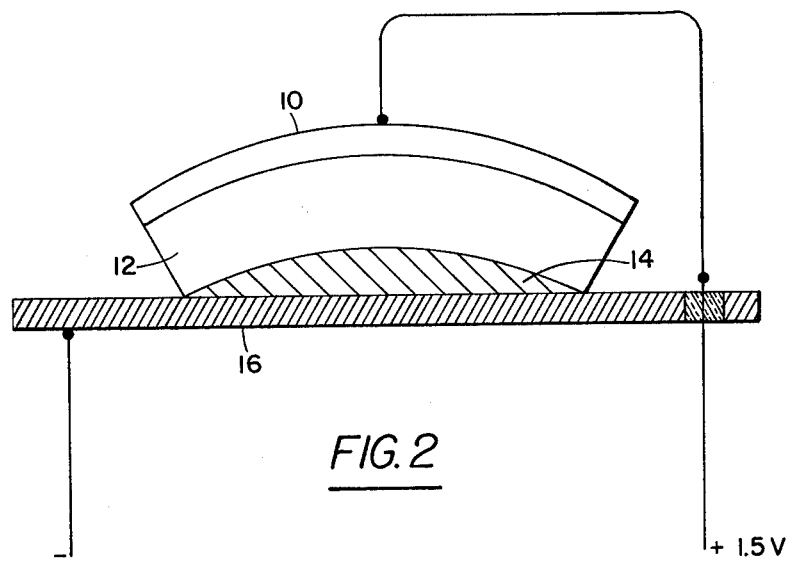
FIG. 2 shows an LED fabricated in accordance with the fabrication process of FIG. 1.

FIG. 2 shows a cross-sectional view of a diode attached to a header according to the teaching of the invention. Referring now to FIG. 2 there is shown a GaAs light emitting diode with a PN junction 10 deposited on a substrate 12. As shown in FIG. 2 the diode has been prestressed by applying a voltage across the diode while the indium 14 is in the liquid state. Current flowing through the chip causes the chip to heat sufficiently to bend to a nonstressed configuration. As can be seen, the chip is bent to form a section of a sphere. The chip, soldered to the header 16, in the bent position will now be under stress, however, at room temperature and without current flow, creep cannot occur. If the diode is now biased for operation, it will be free of stress and therefore degradation due to stress is avoided.

Obviously, many other modifications and variations of the present invention are possible in the light of the above teachings. It is therefore to be understood that within the cope of the appended claims the invention may be practiced otherwise than as specifically described.

What is claimed is:

1. In a method of fabricating a light emitting diode (LED) including a LED chip and a header for supporting said chip, wherein said LED chip is soldered to a header for supporting said chip by means of a soft solder, the improvement comprising the steps of:
attaching a lead to top of chip, heating said solder to a liquid state, applying a voltage across said chip to reconfigure said LED chip into a stress free bent configuration, discontinue heating said solder while continuing to apply said voltage across said chip until said solder solidified, and removing said voltage from across said chip.

2. The method of claim 1 wherein the voltage applied across said chip is approximately 1.5 volts.

3. The method of claim 2 wherein said solder is indium solder.

4. The method of claim 3 wherein said LED is GaAs.